(12) United States Patent
Eum et al.

(10) Patent No.: US 10,930,538 B2
(45) Date of Patent: Feb. 23, 2021

(54) SUBSTRATE ALIGNMENT APPARATUS, SUBSTRATE PROCESSING APPARATUS, AND SUBSTRATE PROCESSING METHOD

(71) Applicant: SEMES CO., LTD., Cheonan-si (KR)

(72) Inventors: Kisang Eum, Cheonan-si (KR); Cheolmin Chol, Cheongju-si (KR); Nam Ki Hong, Cheonan-si (KR)

(73) Assignee: SEMES Co., Ltd., Chungcheongnam-Do (KR)

( * ) Notice: Subject to any disclaimer, the term of this patent is extended or adjusted under 35 U.S.C. 154(b) by 155 days.

(21) Appl. No.: 16/158,638

(22) Filed: Oct. 12, 2018

(65) Prior Publication Data
US 2019/0115239 A1 Apr. 18, 2019

(30) Foreign Application Priority Data
Oct. 12, 2017 (KR) .......................... 10-2017-0132263

(51) Int. Cl.
*H01L 21/68* (2006.01)
*H01L 21/67* (2006.01)
(Continued)

(52) U.S. Cl.
CPC .......... *H01L 21/68* (2013.01); *B65G 49/061* (2013.01); *B65G 49/067* (2013.01); *H01L 21/6715* (2013.01); *H01L 21/67103* (2013.01); *H01L 21/67178* (2013.01); *H01L 21/67196* (2013.01); *H01L 21/67225* (2013.01); *H01L 21/67259* (2013.01); *H01L 21/68707* (2013.01)

(58) Field of Classification Search
CPC .................................................. H01L 211/6875
See application file for complete search history.

(56) References Cited

U.S. PATENT DOCUMENTS

| 7,004,716 B2 * | 2/2006 | Graf ........................ H01L 21/68 414/754 |
| 2006/0096704 A1 * | 5/2006 | Kim .................. H01L 21/67069 156/345.23 |
| 2012/0251964 A1 * | 10/2012 | Inagawa ............. F27B 17/0025 432/11 |

FOREIGN PATENT DOCUMENTS

JP 06275701 A * 9/1994
JP 2008182127 A 8/2008
(Continued)

*Primary Examiner* — Gregory A Wilson
(74) *Attorney, Agent, or Firm* — Procopio, Cory, Hargreaves & Savitch LLP

(57) ABSTRACT

Disclosed are a substrate alignment apparatus, a substrate processing apparatus, and a substrate processing method using the substrate alignment apparatus. The substrate alignment apparatus and the substrate processing apparatus include a support plate and a plurality of guide units coupled to the support plate to align a position of the substrate. Each of the guide units includes an alignment pin for aligning the substrate in place and a stationary body having a support surface for supporting an edge region of the substrate aligned, the stationary part being fixedly coupled to the support plate. The alignment pin is rotatable about a central axis of the alignment pin relative to the support surface of the stationary part, thereby rapidly aligning the substrate and thus preventing the substrate transferred between a plurality of process chambers by a transfer robot from being separated or having a negative influence on other apparatuses.

18 Claims, 14 Drawing Sheets

(51) Int. Cl.
*B65G 49/06* (2006.01)
*H01L 21/687* (2006.01)

(56) References Cited

FOREIGN PATENT DOCUMENTS

| | | | |
|---|---|---|---|
| JP | 2015222754 | A | 12/2015 |
| KR | 20-2000-0020798 | A | 12/2000 |
| KR | 10-2004-0075624 | A | 8/2004 |
| KR | 10-2004-0076733 | A | 9/2004 |
| KR | 10-2006-0127614 | A | 12/2006 |
| KR | 10-2008-0071685 | A | 8/2008 |
| KR | 20130091269 | A | 8/2013 |
| KR | 101390979 | B1 | 5/2014 |
| KR | 20140100221 | A | 8/2014 |

\* cited by examiner

Prior Art

FIG. 11A

| Classification | Fig. 1 | Fig. 2 | Inventive concept |
|---|---|---|---|
| Inventive concept(mm) | 1 | × | 0.5 |
| Positioning time(S) | 1.29 | 0.05 | 0.2 |
| Maximum alignment error(μm) | 660 | 800 | 100 |

FIG. 11B

|  | Rotary type | Stationary type |
|---|---|---|
| Rotation of sloping part | ○ | × |
| Height of body(mm) | 0.5 | 0.5 |
| Positioning time(S) | 0.11 | 0.14 |
| maximum alignment error(μm) | 100 | 160 |

SUBSTRATE ALIGNMENT APPARATUS, SUBSTRATE PROCESSING APPARATUS, AND SUBSTRATE PROCESSING METHOD

CROSS-REFERENCE TO RELATED APPLICATIONS

A claim for priority under 35 U.S.C. § 119 is made to Korean Patent Application No. 10-2017-0132263 filed on Oct. 12, 2017, in the Korean Intellectual Property Office, the entire contents of which are hereby incorporated by reference.

BACKGROUND

Embodiments of the inventive concept described herein relate to a substrate alignment apparatus, a substrate processing apparatus, and a substrate processing method, and more particularly, relate to a substrate alignment apparatus, a substrate processing apparatus, and a substrate processing method, in which a guide unit for aligning a substrate rotates to minimize wear caused by friction with the substrate, thereby increasing durability life.

Various processes, such as deposition, photolithography, etching, cleaning, and the like, are performed to manufacture semiconductor devices. An apparatus for performing some of the processes has a plurality of chambers. A substrate is processed in any one chamber and then transferred to another chamber.

For example, a substrate processing apparatus for performing a photolithography process includes a coating chamber for coating a substrate with a light-sensitive material such as photoresist, a bake chamber for heating or cooling the substrate before or after coating the substrate with the light-sensitive material, an edge exposing chamber for performing an exposing process on an edge region of the substrate, and the like. The substrate is transferred to the chambers in a preset sequence.

A substrate has to be placed in a predetermined right position on a unit that supports the substrate inside a chamber. When the substrate is processed in a misaligned state, process failures are likely to occur. For example, when an edge region of the substrate is processed with the substrate misaligned, a specific chemical or a rinsing solution may unintentionally affect a central portion of the substrate, and therefore the qualities of process outputs may not meet reference values. In some cases, the central portion and the edge of the substrate that are exposed to the chemical or the rinsing solution may be damaged.

Accordingly, the substrate has to be aligned in the case where the substrate is transferred in a misaligned state on a transfer unit or is not in place on the unit that supports the substrate inside the chamber.

In general, a substrate is aligned by a plurality of guide units. For the alignment of the substrate, the plurality of guide units is arranged at constant intervals in a preset alignment range. The substrate, when aligned, is placed on the guide units so as to be located between the guide units. The substrate falls freely and is seated in the space restricted by the guide units (that is, in the alignment range) and aligned in an intended right position.

As illustrated in FIG. 1, a guide unit G for aligning a substrate W in the related art includes a sloping part S that makes contact with the bevel of the substrate W to direct the substrate W toward the center of an alignment range and a body V that extends downward from the sloping part S and that is located perpendicular to the substrate W to prevent the substrate W from deviating from the guide unit G. A support surface R on which the substrate W is seated is provided on a lower end portion of the body V. In order to locate the substrate W between a plurality of bodies V, the distance between two bodies V facing each other, among the plurality of bodies V, is equal to the sum of the diameter of the substrate W and a preset clearance.

However, when the substrate W is aligned using the above-configured guide unit, it takes much time to align the substrate W, and the substrate W often fails to descend to the support surface R because the height of the body V is greater than necessary.

FIG. 2 is a view illustrating a guide unit of a different type from the guide unit described above. In the case where a guide unit G, as illustrated in FIG. 2, includes only a sloping part S, time until a substrate W is seated is shorter than that in the above-described case, but part of the edge of the substrate W is often placed on the sloping part S so that the substrate W is misaligned.

SUMMARY

Embodiments of the inventive concept provide a substrate alignment apparatus, a substrate processing apparatus, and a substrate processing method for efficiently aligning a substrate.

Embodiments of the inventive concept provide a substrate alignment apparatus, a substrate processing apparatus, and a substrate processing method for increasing the accuracy of alignment of a substrate and simultaneously reducing time spent on the alignment of the substrate.

Aspects of the inventive concept are not limited thereto, and any other aspects not mentioned herein will be clearly understood from the following description by those skilled in the art to which the inventive concept pertains.

According to an aspect of an embodiment, an apparatus for aligning a substrate includes a support plate and a plurality of guide units coupled to the support plate to align a position of the substrate. Each of the guide units includes an alignment pin for aligning the substrate in place and a stationary body having a support surface for supporting an edge region of the substrate aligned, the stationary part being fixedly coupled to the support plate. The alignment pin is rotatable about a central axis of the alignment pin relative to the support surface of the stationary part.

The alignment pin may include a sloping part having a conical or frusto-conical shape with a gradually increasing cross-section toward a bottom and a body extending downward from the sloping part to the stationary part and having a side perpendicular to the support plate.

The alignment pin may rotate when the substrate falls along the sloping part.

The body may have a height smaller than a thickness of the substrate.

The body may have a height equal to half a thickness of the substrate.

One of the body and the support surface may have an insertion protrusion, and the other may have a recess into which the insertion protrusion is inserted.

The insertion protrusion may have a cylindrical shape and may have a diameter smaller than an inner diameter of the recess.

A bearing may be mounted on the insertion protrusion or inserted into the recess.

The stationary part may include a support body having the support surface and a support shaft extending from the support body and fixedly coupled to the support plate.

According to another aspect of an embodiment, an apparatus for aligning a substrate includes a support plate and a plurality of guide units coupled to the support plate to align a position of the substrate. Each of the guide units includes an alignment pin that includes a sloping part having a conical or frusto-conical shape with a gradually increasing cross-section toward a bottom and a body extending downward from the sloping part to the stationary part and having a side perpendicular to the support plate. The body has a height smaller than a thickness of the substrate.

The height of the body may be equal to half the thickness of the substrate.

According to another aspect of an embodiment, an apparatus for processing a substrate includes a support plate and a plurality of guide units coupled to the support plate to align a position of the substrate. Each of the guide units includes an alignment pin that includes a sloping part having a conical or frusto-conical shape with a gradually increasing cross-section toward a bottom and a body extending downward from the sloping part to the stationary part and having a side perpendicular to the support plate. The alignment pin is rotatable about a central axis of the alignment pin relative to the support plate.

The body may have an insertion protrusion protruding downward from the body. The support plate may have a recess into which the insertion protrusion is inserted. The insertion protrusion may be rotatable within the recess.

The apparatus may further include a heater for heating the substrate placed on the support plate.

A height of the body may be equal to half a thickness of the substrate or smaller than the thickness of the substrate.

According to another aspect of an embodiment, provided is a method for processing a substrate using substrate processing equipment that includes a transfer chamber having a transfer robot for transferring the substrate, a plurality of process chambers disposed on a side of the transfer chamber to process the substrate, and the substrate alignment apparatus of any one of claims 1 to 5 that is disposed on a side of the transfer chamber. The method includes retrieving a substrate from one of the process chambers by using the transfer robot, measuring an alignment state of the substrate placed on the transfer robot, transferring the substrate to the substrate alignment apparatus by the transfer robot when the alignment state is poor, aligning a position of the substrate in the substrate alignment apparatus, and retrieving the substrate from the substrate alignment apparatus and then transferring the substrate to another one of the process chambers by the transfer robot.

The transfer robot may include a hand that has the substrate placed thereon and displaces the substrate to the process chambers or the substrate alignment apparatus, a measurement member included in the hand to determine the alignment state of the substrate, and a controller that receives a signal from the measurement member and determines the alignment state of the substrate. The controller controls the transfer robot to transfer the substrate to the substrate alignment apparatus when the alignment state of the substrate placed on the hand is poor.

The process chambers may include a liquid processing chamber that processes the substrate by supplying liquid to the substrate and a bake chamber that heats the substrate.

According to embodiments of the inventive concept, a substrate moving between a plurality of process chambers and a transfer robot can be aligned so as not to deviate from a right position and have a negative influence on other apparatuses.

According to the embodiments of the inventive concept, the alignment pin of the guide unit rotates, thereby minimizing kinetic energy loss of a substrate. Furthermore, a portion of the guide unit that makes frictional contact with a substrate changes every time, so that wear of the guide unit can be minimized and durability life can be increased.

In addition, according to the embodiments of the inventive concept, the body of the guide unit has a height greater than half the thickness of a substrate and smaller than the thickness of the substrate, whereby kinetic energy loss of the substrate due to the contact between the substrate and the body can be optimized for alignment of the substrate, and thus time taken to position the substrate can be minimized.

Effects of the inventive concept are not limited to the above-described effects, and any other effects not mentioned herein may be clearly understood from this specification and the accompanying drawings by those skilled in the art to which the inventive concept pertains.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 11A illustrates a table that lists alignment results of the guide unit according to the inventive concept and the guide units according to the related art;

FIG. 11B illustrates a table that lists alignment results of a rotary guide unit and a stationary guide unit;

DETAILED DESCRIPTION

Substrate processing equipment of the inventive concept may be used to perform a photolithography process on substrates such as semiconductor wafers or flat display panels. In particular, the substrate processing equipment of the inventive concept may be coupled to a stepper and may perform a coating process and a developing process on the substrates. In the following description, it will be exemplified that wafers are used as the substrates.

Figure 3:
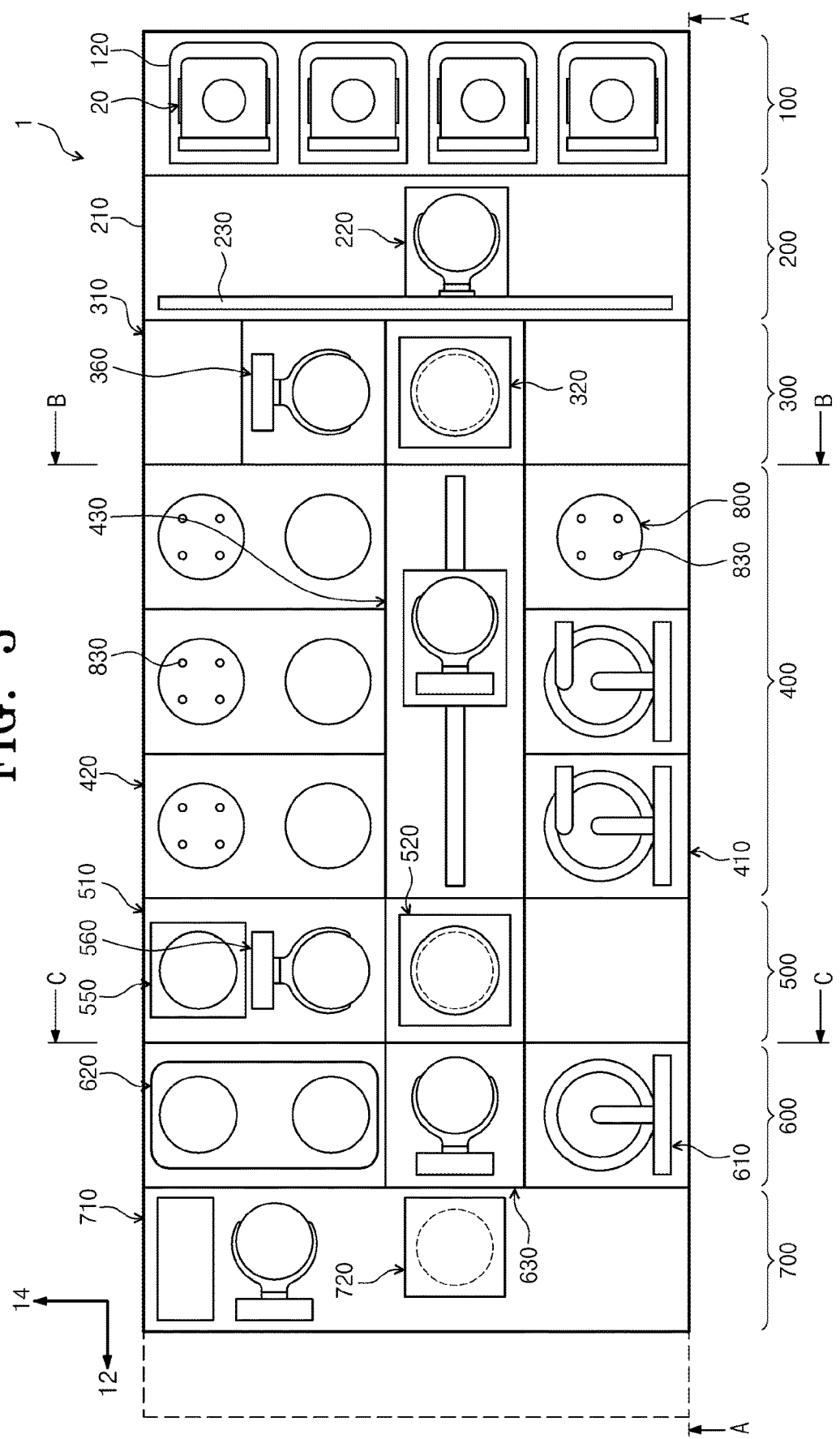
FIG. 3 is a view from above substrate processing equipment according to an embodiment of the inventive concept.
Figure 4:
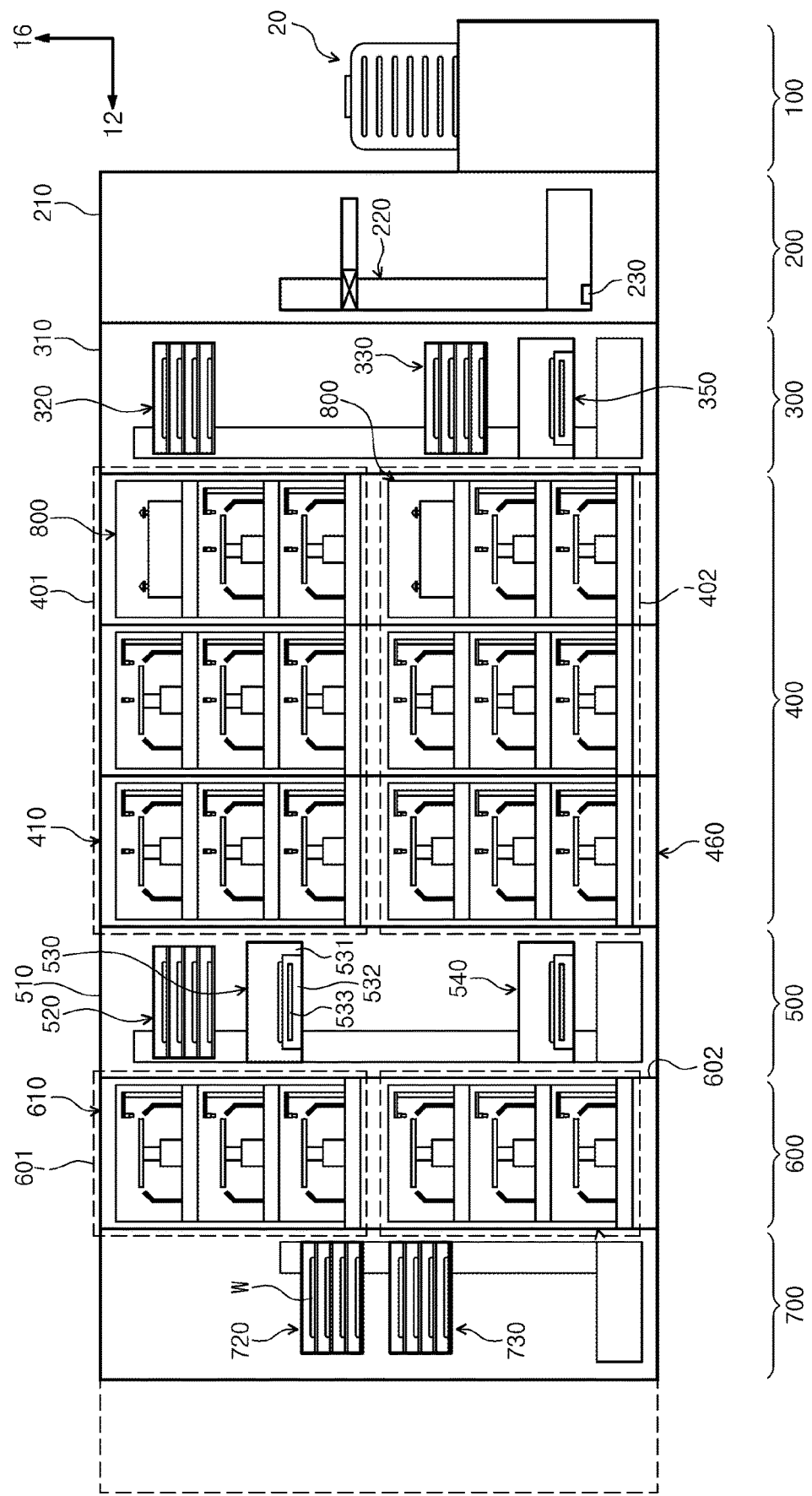
FIG. 4 is a view illustrating the substrate processing equipment of FIG. 3 when viewed in direction A-A.
Figure 5:
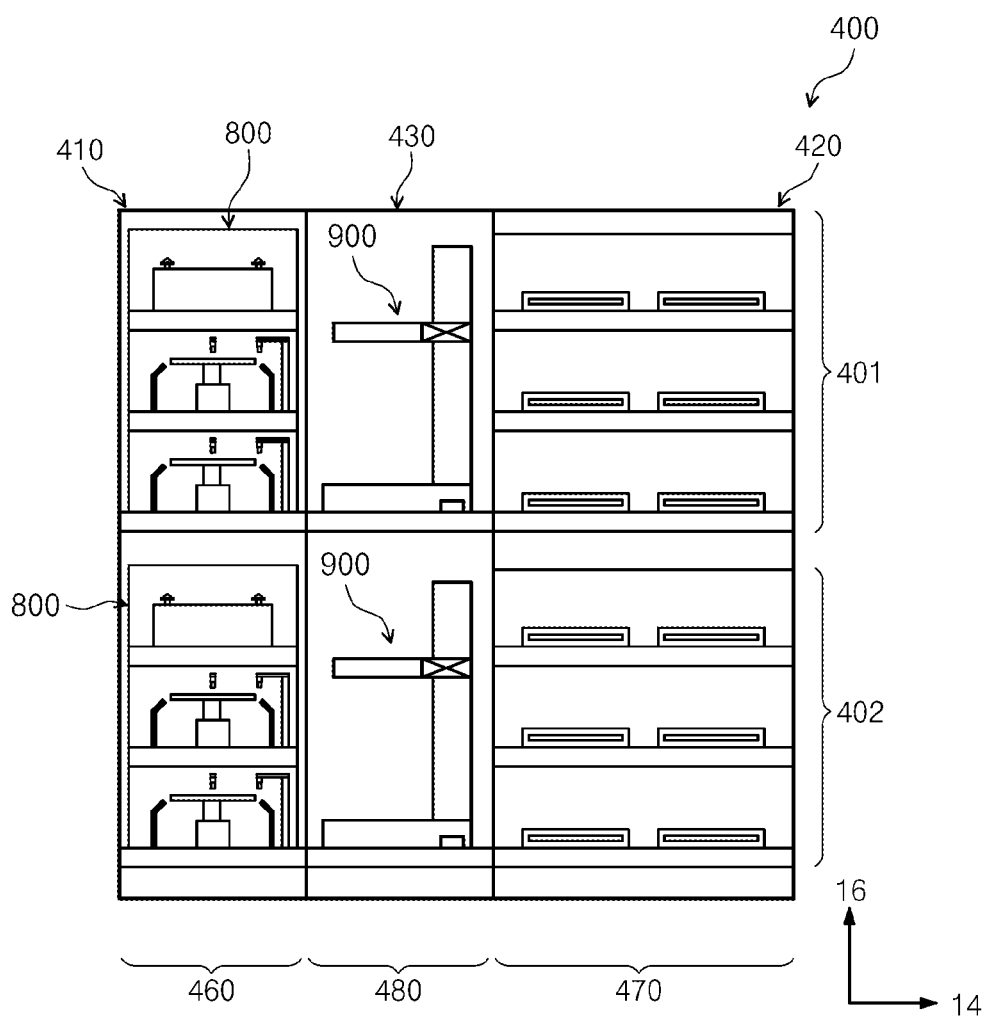
FIG. 5 is a view illustrating the substrate processing equipment of FIG. 3 when viewed in direction B-B.
Figure 6:
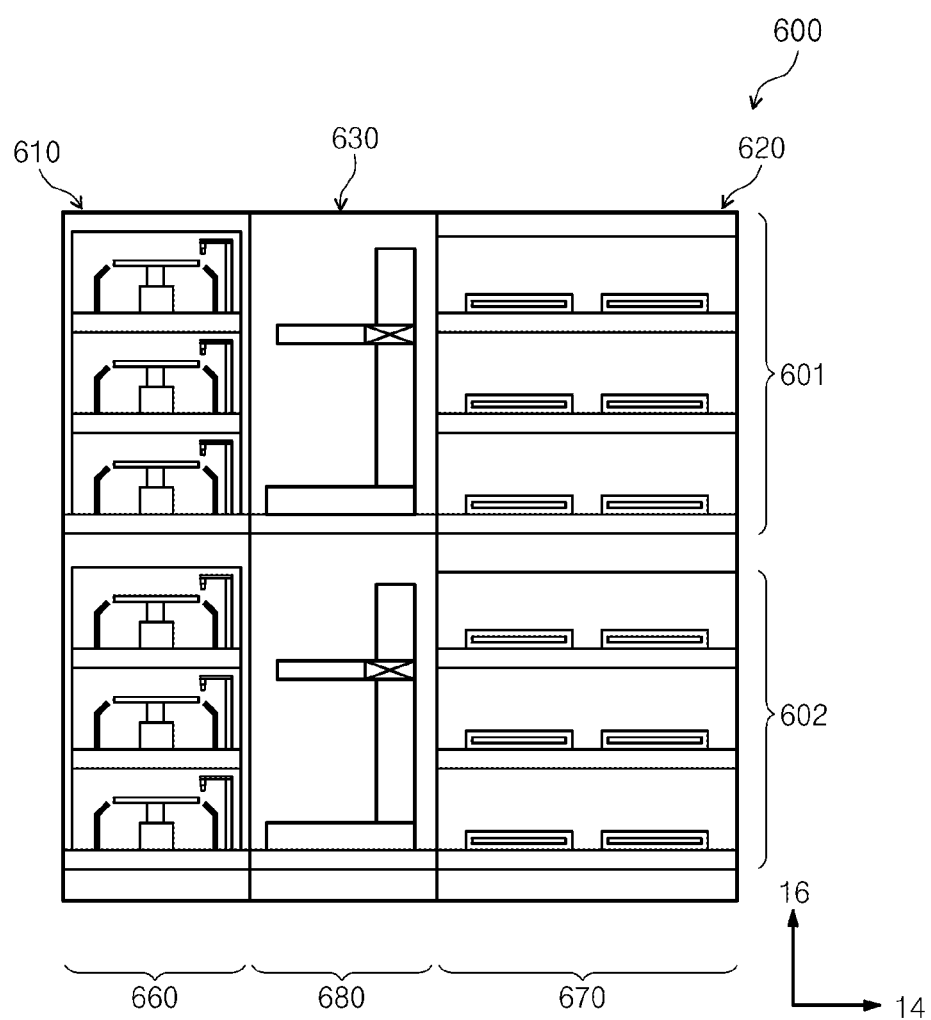
FIG. 6 is a view illustrating the substrate processing equipment of FIG. 3 when viewed in direction C-C.
Figure 7:
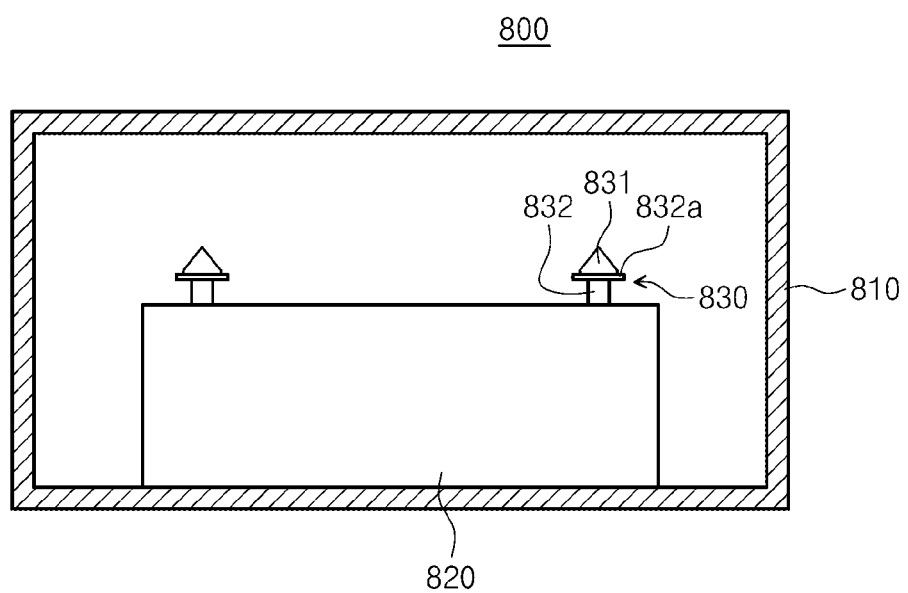
FIG. 7 is a cross-sectional view illustrating a substrate alignment apparatus mounted in a coating and developing module of FIG. 3.
Figure 8:
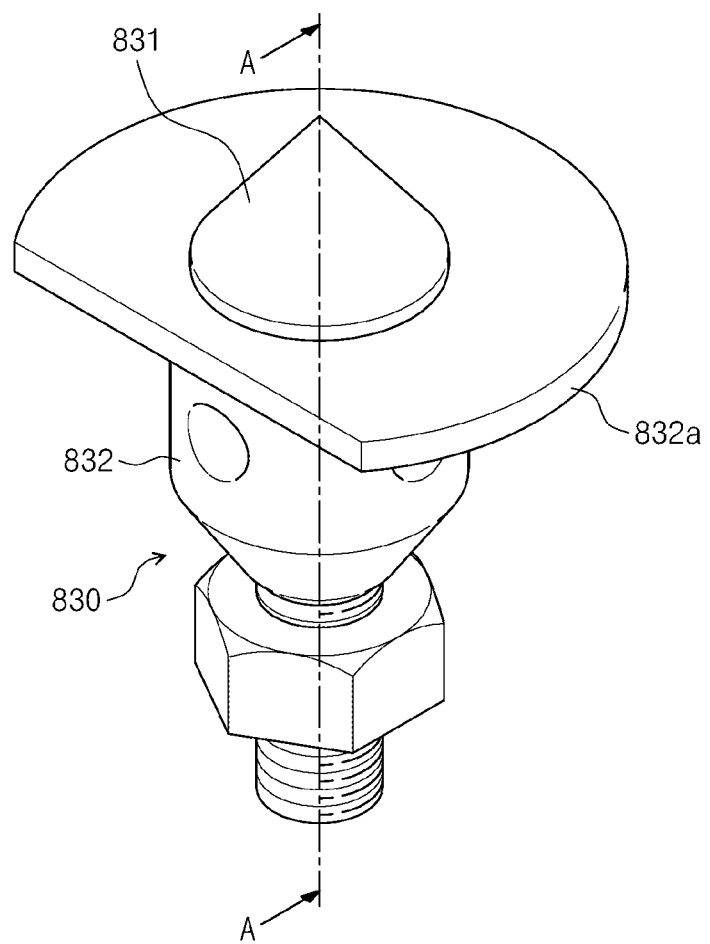
FIG. 8 is a perspective view illustrating a guide unit of FIG. 7.
Figure 9:
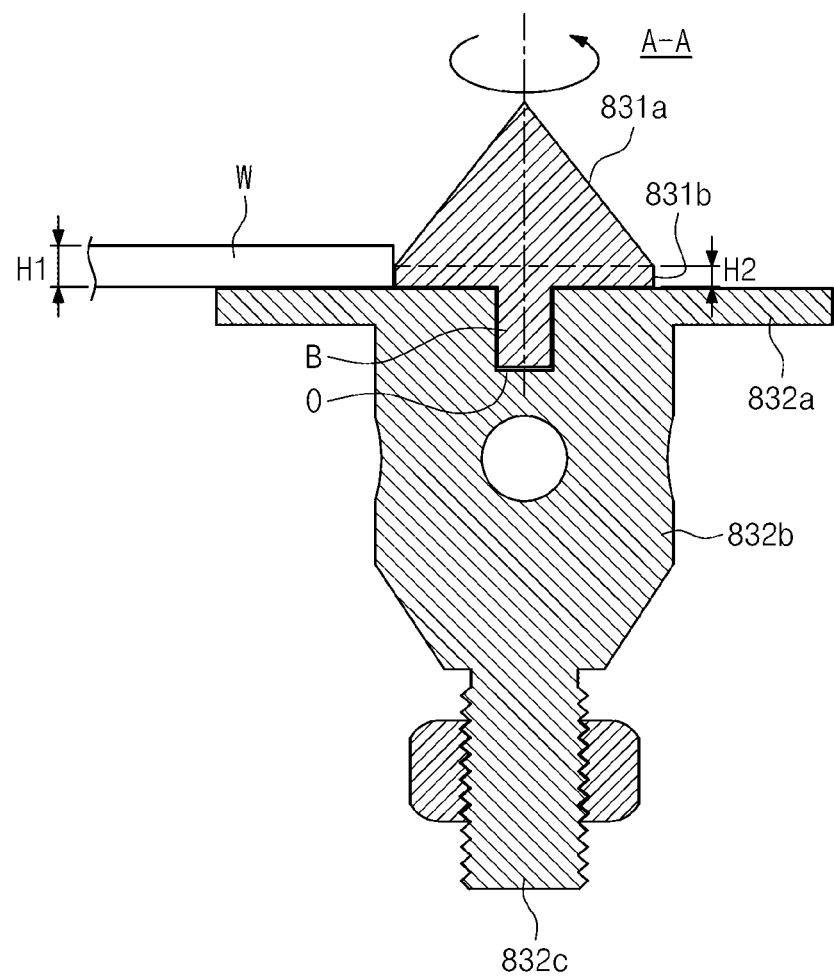
FIG. 9 is a cross-sectional view illustrating the guide unit of FIG. 7.

FIGS. 3 to 6 are schematic views illustrating substrate processing equipment 1 according to an embodiment of the inventive concept. FIG. 3 is a view from above the substrate processing equipment 1. FIG. 4 is a view illustrating the substrate processing equipment 1 of FIG. 3 when viewed in direction A-A. FIG. 5 is a view illustrating the substrate processing equipment 1 of FIG. 3 when viewed in direction B-B. FIG. 6 is a view illustrating the substrate processing equipment 1 of FIG. 3 when viewed in direction C-C.

Referring to FIGS. 3 to 6, the substrate processing equipment 1 may include a load port 100, an index module 200, a first buffer module 300, a coating and developing module 400, a second buffer module 500, a pre/post-exposure processing module 600, and an interface module 700.

Hereinafter, a first direction 12 may refer to a direction in which the load port 100, the index module 200, the first buffer module 300, the coating and developing module 400, the second buffer module 500, the pre/post-exposure processing module 600, and the interface module 700 are arranged. A second direction 14 may refer to a direction that is perpendicular to the first direction 12 when viewed from above, and a third direction 16 may refer to a direction that is perpendicular to the first direction 12 and the second direction 14.

Substrates W may be received in cassettes 20. The cassettes 20 may have an airtight structure. For example, front open unified pods (FOUPs) with a door at the front thereof may be used as the cassettes 20.

Hereinafter, the load port 100, the index module 200, the first buffer module 300, the coating and developing module 400, the second buffer module 500, the pre/post-exposure processing module 600, and the interface module 700 will be described in detail.

Figure 1:
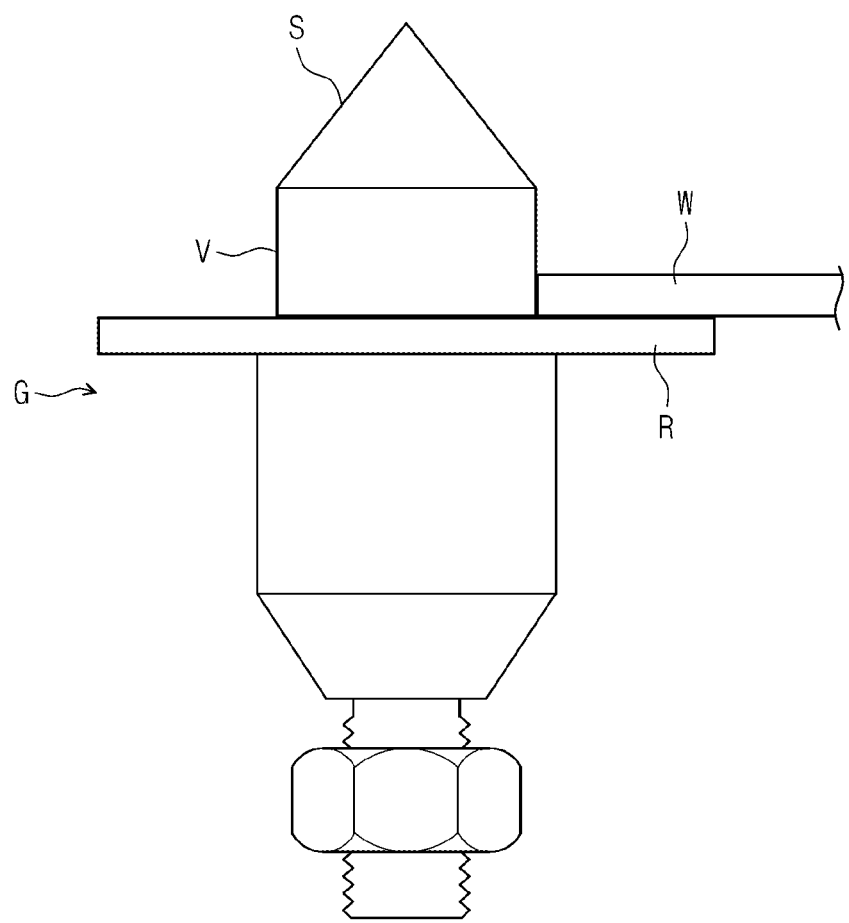
FIG. 1 is a view illustrating a guide unit according to the related art.

The load port 100 may have mounting tables 120 on which the cassettes 20 having the substrates W received therein are placed. The mounting tables 120 may be arranged in a row along the second direction 14. FIG. 1 illustrates an example that four mounting tables 120 are arranged in a row.

The index module 200 may transfer the substrates W between the cassettes 20 placed on the mounting tables 120 of the load port 100 and the first buffer module 300. The index module 200 may include a frame 210, an index robot 220, and a guide rail 230. The frame 210 may have a rectangular parallelepiped shape with an empty space inside and may be disposed between the load port 100 and the first buffer module 300.

The first buffer module 300 may include a frame 310, a first buffer 320, a second buffer 330, a cooling chamber 350, and a first buffer robot 360. The frame 310 may have a rectangular parallelepiped shape with an empty space inside and may be disposed between the index module 200 and the coating and developing module 400. The first buffer 320, the second buffer 330, the cooling chamber 350, and the first buffer robot 360 may be located inside the frame 310. The first buffer 320 and the second buffer 330 may temporarily store the substrates W. The first buffer robot 360 may transfer the substrates W between the first buffer 320 and the second buffer 330. The cooling chamber 350 may be used to cool the substrates W.

The coating and developing module 400 may perform a process of coating the substrates W with photoresist before an exposing process and may perform a developing process on the substrates W after the exposing process. The coating and developing module 400 may have a rectangular parallelepiped shape. The coating and developing module 400 may include a coating module 401 and a developing module 402.

The coating module 401 and the developing module 402 may be arranged so as to be vertically divided from each other. According to an embodiment, the coating module 401 may be located above the developing module 402.

The coating module 401 may perform a process of coating the substrates W with a light-sensitive material such as photoresist and a heat treatment process, such as heating or cooling, on the substrates W before and after the photoresist coating process.

The coating module 401 may include photoresist coating chambers 410, bake chambers 420, and a transfer chamber 430. The photoresist coating chambers 410, the transfer chamber 430, and the bake chambers 420 may be sequentially arranged along the second direction 14. Accordingly, the photoresist coating chambers 410 and the bake chambers 420 may be spaced apart from each other in the second direction 14, with the transfer chamber 430 therebetween.

The photoresist coating chambers 410 may be arranged in the first direction 12 and the third direction 16. The drawings illustrate an example that six photoresist coating chambers 410 are arranged.

The bake chambers 420 may perform heat treatment on the substrates W. For example, the bake chambers 420 may perform a prebake process of removing organics or moisture on the substrates W by heating the substrates W to a predetermined temperature before coating the substrates W with photoresist, or may perform a soft bake process after coating the substrates W with photoresist. In addition, the bake chambers 420 may perform a process of cooling the substrates W after the heating processes.

The transfer chamber 430 may be located side by side with the first buffer 320 of the first buffer module 300 in the first direction 12.

The developing module 402 may perform a developing process of removing part of the photoresist by supplying a developing solution to the substrates W to obtain a pattern on the substrates W and a heat treatment process of heating or cooling the substrates W before or after the developing process. The developing module 402 may include developing chambers 460, bake chambers 470, and a transfer chamber 480. The developing chambers 460, the transfer chamber 480, and the bake chambers 470 may be sequentially arranged along the second direction 14.

The developing chambers 460 may have the same structure. However, the types of developing solutions used in the developing chambers 460 may differ from one another. The developing chambers 460 may remove regions of the photoresist on the substrates W that are exposed to light. At this time, regions of a protective film that are exposed to light may also be removed. Alternatively, depending on the type of photoresist used, only regions of the photoresist and the protective film that are not exposed to light may be removed.

The bake chambers 470 of the developing module 402 may perform heat treatment on the substrates W. For example, the bake chambers 470 may perform a post bake process of heating the substrates W before a developing process, a hard bake process of heating the substrates W after the developing process, and a cooling process of cooling the heated substrates W after the bake processes.

The second buffer module 500 may serve as a passage through which the substrates W are carried between the coating and developing module 400 and the pre/post-exposure processing module 600. In addition, the second buffer module 500 may perform a predetermined process, such as a cooling process or an edge exposing process, on the substrates W. The second buffer module 500 may include a frame 510, a buffer 520, a first cooling chamber 530, a second cooling chamber 540, an edge exposing chamber 550, and a second buffer robot 560.

In the case where the stepper performs liquid immersion lithography, the pre/post-exposure processing module 600 may perform a process of coating protective films that protect photoresist films on the substrates W during the liquid immersion lithography. Furthermore, the pre/post-exposure processing module 600 may perform a process of cleaning the substrates W after the exposing process. In addition, in the case where a coating process is performed using chemically amplified resist, the pre/post-exposure processing module 600 may perform a post-exposure bake process.

The pre/post-exposure processing module 600 may include a pre-processing module 601 and a post-processing module 602. The pre-processing module 601 may process the substrates W before an exposing process, and the post-processing module 602 may process the substrates W after the exposing process.

In the pre/post-exposure processing module 600, the pre-processing module 601 and the post-processing module 602 may be completely separated from each other.

The pre-processing module 601 may include protective-film coating chambers 610, bake chambers 620, and a transfer chamber 630. The protective-film coating chambers 610, the transfer chamber 630, and the bake chambers 620 may be sequentially arranged along the second direction 14.

Accordingly, the protective-film coating chambers 610 and the bake chambers 620 may be spaced apart from each other in the second direction 14, with the transfer chamber 630 therebetween. The protective-film coating chambers 610 may be vertically arranged along the third direction 16.

Alternatively, the protective-film coating chambers 610 may be arranged in the first direction 12 and the third direction 16. The bake chambers 620 may be vertically arranged along the third direction 16. Alternatively, the bake chambers 620 may be arranged in the first direction 12 and the third direction 16.

The post-processing module 620 may include cleaning chambers 660, post-exposure bake chambers 670, and a transfer chamber 680. The cleaning chambers 660, the transfer chamber 680, and the post-exposure bake chambers 670 may be sequentially arranged along the second direction 14.

Accordingly, the cleaning chambers 660 and the post-exposure bake chambers 670 may be spaced apart from each other in the second direction 14, with the transfer chamber 680 therebetween. The cleaning chambers 660 may be vertically arranged along the third direction 16.

Alternatively, the cleaning chambers 660 may be arranged in the first direction 12 and the third direction 16. The post-exposure bake chambers 670 may be vertically arranged along the third direction 16. Alternatively, the post-exposure bake chambers 670 may be arranged in the first direction 12 and the third direction 16.

The interface module 700 may transfer the substrates W between the pre-processing module 601 and the post-processing module 602. The interface module 700 may include a frame 710, a first buffer 720, a second buffer 730, and an interface robot 740. The first buffer 720, the second buffer 730, and the interface robot 740 may be located inside the frame 710.

The first buffer 720 and the second buffer 730 may be vertically spaced apart from each other by a predetermined distance. The first buffer 720 may be disposed in a higher position than the second buffer 730. The first buffer 720 may be located at the height corresponding to the pre-processing module 601, and the second buffer 730 may be disposed at the height corresponding to the post-processing module 602. When viewed from above, the first buffer 720 may be aligned with the transfer chamber 630 of the pre-processing module 601 along the first direction 12, and the second buffer 730 may be aligned with the transfer chamber 680 of the post-processing module 602 along the first direction 12.

According to an embodiment of the inventive concept, the above-configured substrate processing equipment may include a substrate alignment apparatus 800 mounted in the coating and developing module 400. As illustrated in FIGS. 7 to 10, the substrate alignment apparatus 800 may include a chamber 810, a support plate 820, and guide units 830. The chamber 810 may have an opening through which a substrate is transferred into or out of the chamber 810. The chamber 810 may be mounted in the coating module 401 and the developing module 402. The support plate 820 may be located inside the chamber 810.

The guide units 830 may be installed on the support plate 820. The guide units 830 may be in combination with one another to form a space in which a substrate W is placed. Each of the guide units 830 may include an alignment pin 831 and a stationary body 832. The alignment pin 831 may allow the substrate W to be aligned in place. The stationary body 832 may have a support surface 832a that supports the edge of the aligned substrate W. The stationary body 832 may be fixedly coupled to the support plate 820. The alignment pin 831 may rotate about its axis relative to the support surface 832a.

The alignment pin 831 may include a sloping part 831a and a body 831b. The sloping part 831a may have a conical or frusto-conical shape that has a gradually increasing cross-section toward the bottom thereof. The alignment pin 831 may rotate about its axis when the substrate W descends along the sloping part 831a.

The body 831b may extend downward from the sloping part 831a to the stationary part 832 and may have a side perpendicular to the support plate 820. The height H2 of the body 831b may be smaller than the thickness H1 of the substrate W. According to an embodiment, the height H2 of the body 831b may not be smaller than half the thickness H1 of the substrate W. For example, the height H2 of the body 831b may be equal to half the thickness H1 of the substrate W.

Figure 10:
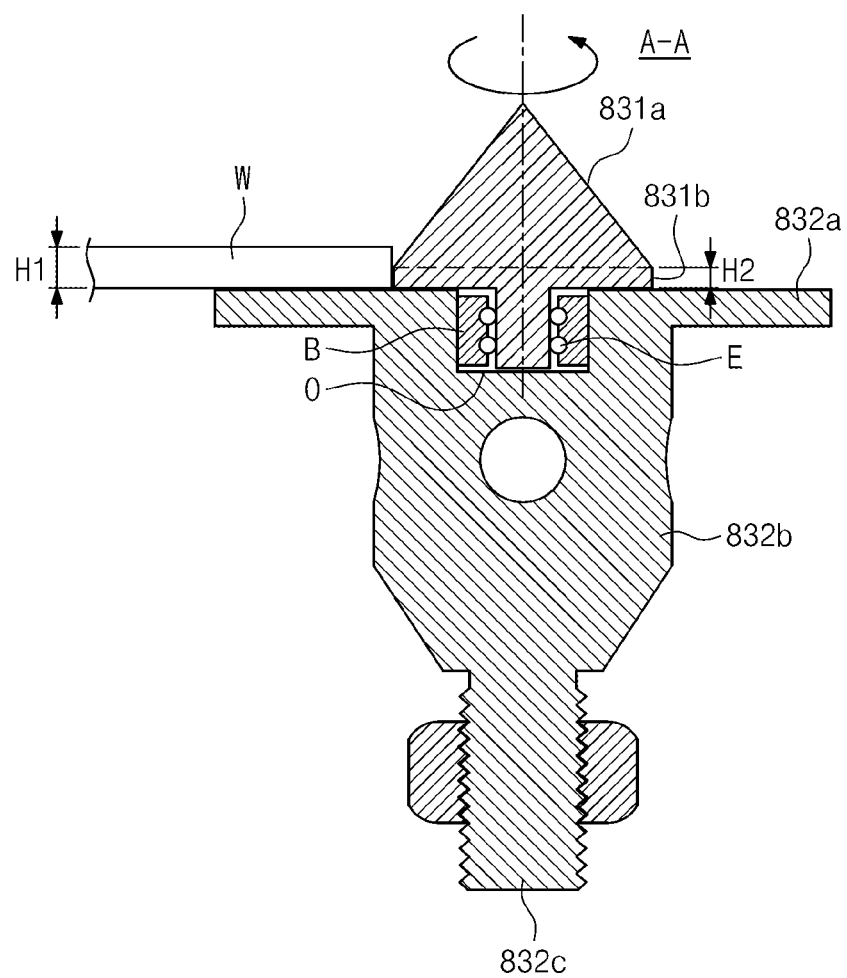
FIG. 10 is a cross-sectional view illustrating the guide unit of FIG. 7.

The body 831b may have an insertion protrusion B, and the support surface 832a may have a recess O into which the insertion protrusion B is inserted. Alternatively, the body 831b may have a recess O, and the support surface 832a may have an insertion protrusion B. The insertion protrusion B may have a cylindrical shape with a diameter smaller than the inner diameter of the recess O. According to an embodiment, a bearing E, as illustrated in FIG. 10, may be mounted on the insertion protrusion B or inserted into the recess O.

The stationary part 832 may include a support body 832b and a support shaft 832c. The support body 832b may have a circular cylindrical shape, and the support surface 832a may be located on the top of the support body 832b. The support shaft 832c may extend from the support body 832b and may be fixedly coupled to the support plate 820.

The substrate W, when placed between the guide units 830, may descend along the sloping parts 831a. At this time, the alignment pins 831 may rotate to bounce the substrate W, thereby minimizing friction with the substrate W.

The position of the substrate W may be restricted by the bodies 831b. Since the heights H2 of the bodies 831b are greater than half the thickness H1 of the substrate W and smaller than the thickness H1 of the substrate W, kinetic energy loss of the substrate W due to the contact between the substrate W and the bodies 831b may be optimized for alignment of the substrate W. Accordingly, the guide units 830 may allow the substrate W to be more rapidly aligned in place than the guide units in the related art.

Figure 2:
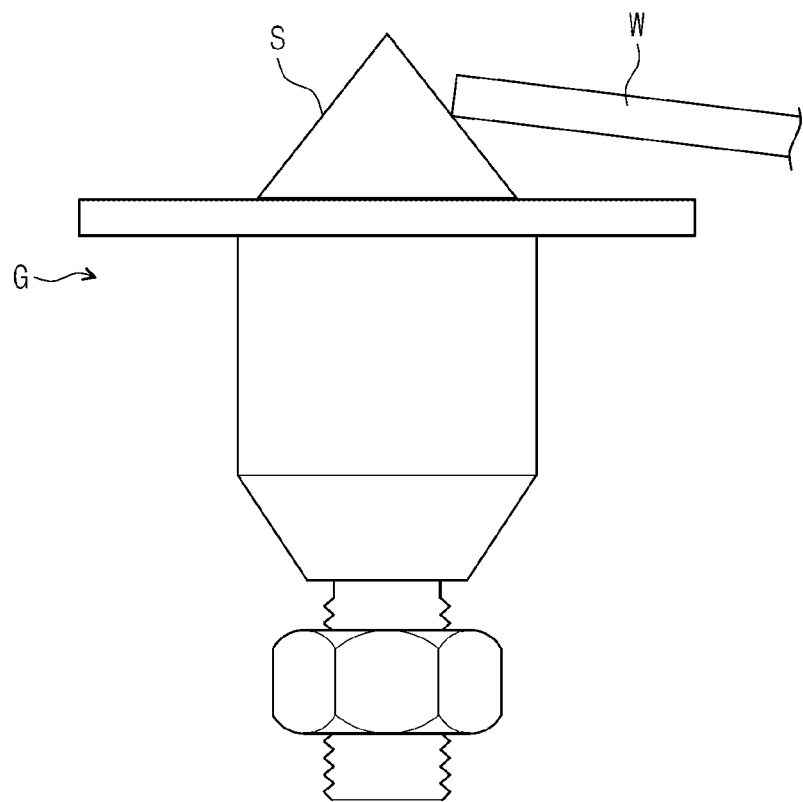
FIG. 2 is a view illustrating a guide unit according to the related art.

FIG. 11A illustrates a table that lists results obtained by performing alignment tests on a substrate W of thickness 0.8 mm a plurality of times with the conventional guide units G, which are illustrated in FIG. 1 ((hereinafter, referred to as the type 1 guide unit) and FIG. 2 ((hereinafter, referred to as the type 2 guide unit), and the guide unit 830 of the inventive concept. The positioning time refers to the amount of time taken for the substrate W to fall onto the guide units G and 830 and come to rest on the support surfaces R and 832a. The alignment error refers to the distance by which the substrate W deviated from the right position that was set for alignment of the substrate W.

The body V of the type 1 guide unit had the height of 1 mm greater than the height of the substrate W. The alignment tests on the substrate W with the type 1 guide unit showed that the minimum positioning time was 1.29 seconds, but there was a case where the substrate W was not positioned. The maximum alignment error was 660 micrometers.

As mentioned above, the type 2 guide unit was not provided with the body V. That is, the body V of the type 2 guide unit had the height of 0 mm. The alignment tests on the substrate W with the type 2 guide unit showed that the positioning time was the shortest at 0.05 seconds, but the substrate W was frequently misaligned, with part of the edge of the substrate W placed on the sloping part S. The maximum alignment error was 800 micrometers.

The guide unit 830 of the inventive concept was not rotated for comparison with the type 1 guide unit and the type 2 guide unit. The body 831b of the guide unit 830 of the inventive concept had the height of 0.5 mm smaller than the thickness of the substrate W.

The alignment tests on the substrate W with the guide unit 830 of the inventive concept showed that the positioning time was 0.2 seconds, and the maximum alignment error was 100 micrometers.

In the case where the height of the body 831b was smaller than the thickness of the substrate W, the guide unit 830 had a smaller alignment error and a shorter positioning time than the type 1 guide unit and the type 2 guide unit even though the guide unit 830 was not rotated.

FIG. 11B illustrates a table that lists results obtained by performing alignment tests on a substrate W of thickness 0.8 mm a plurality of times with a rotary guide unit and a stationary guide unit.

The positioning time refers to the amount of time taken for the substrate W to fall onto the guide unit 830 and come to rest on the support surface 832a. The alignment error refers to the distance by which the substrate W deviated from the right position that was set for alignment of the substrate W.

For the rotary guide unit and the stationary guide unit, the body 831b had the height of 0.5 mm smaller than the thickness of the substrate W.

In the case of the rotary guide unit, the positioning time was very short at 0.11 seconds, and the maximum alignment error was 100 micrometers, showing a very stable substrate alignment result.

In the case of the stationary guide unit, the positioning time was 0.14 seconds slightly differing from the positioning time of the rotary guide unit, and the maximum alignment error was 160 micrometers, showing a very stable substrate alignment result.

Consequently, it can be seen that the substrate W was more rapidly aligned when the guide 830 was rotated than when the guide 830 was not rotated.

Although not illustrated in FIG. 11B, the substrate W was very stably aligned when the guide unit 830 was rotated even though the height of the body 831b was 0.9 mm greater than the thickness of the substrate W. In this case, the positioning time was very short at 0.17 seconds, and the maximum alignment error was 170 micrometers.

The contents described above in relation to FIGS. 11A and 11B may be summarized as follows. When the height of the body 831b was smaller than the thickness of the substrate W, the substrate W was stably aligned within a shorter period of time. Further, the substrate W was more rapidly aligned when the guide 830 was rotated than when the guide 830 was not rotated.

Figure 12:
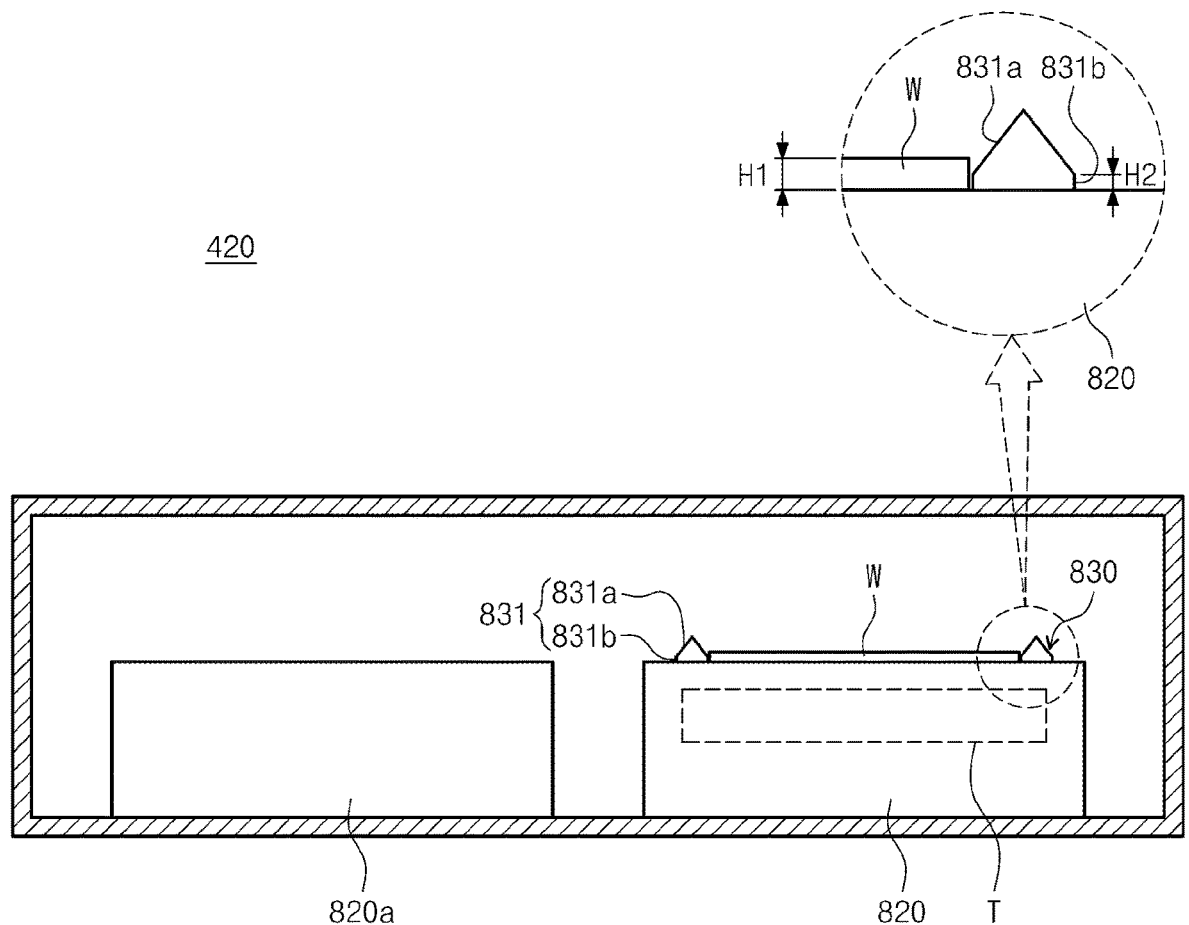
FIG. 12 is a cross-sectional view illustrating a bake chamber of FIG. 3.

FIG. 12 is a view illustrating the bake chamber 420 according to an embodiment of the inventive concept. The bake chamber 420 may include a chamber, a support plate 820, and a cooling plate 820a.

The chamber may form the exterior of the bake chamber 420 and may have a space in which a substrate W is processed. The support plate 820 may heat the substrate W transferred into the bake chamber 420. A plurality of guide units 830 for aligning the substrate W are installed on the support plate 820. The cooling plate 820a may cool the substrate W transferred into the bake chamber 420 or to be transferred out of the bake chamber 420, thereby preventing surrounding apparatuses from being damaged by the temperature of the substrate W.

The substrate W transferred into the bake chamber 420 may be brought into close contact with the support plate 820 to receive heat from the support plate 820 Therefore, alignment pins 831 included in the guide units 830 may be directly installed on the support plate 820. Furthermore, a heater T may be mounted in the support plate 820 to transfer heat to the substrate W.

In order to allow the alignment pins 831 to rotate when making contact with the substrate W, the support plate 820 may have recesses O and the alignment pins 831 may have insertion protrusions B that are inserted into the recesses O, respectively. A body 831b of each alignment pin 831 may have a height H2 that is smaller than the thickness H1 of the substrate W and greater than half the thickness H1 of the substrate W.

The cooling plate 820a for cooling the substrate W may be disposed on a side of the support plate 820. Before the substrate W subjected to a bake process is transferred for a post process, the cooling plate 820a may lower the temperature of the substrate W, thereby preventing other apparatuses, including a transfer unit, from being damaged by the heat of the substrate W.

Transfer robots 900 in the transfer chambers 430 and 480 may transfer the substrates W between the substrate alignment apparatuses 800, the coating chambers 410, the bake chambers 420 and 470, and the developing chambers 460.

Figure 13:
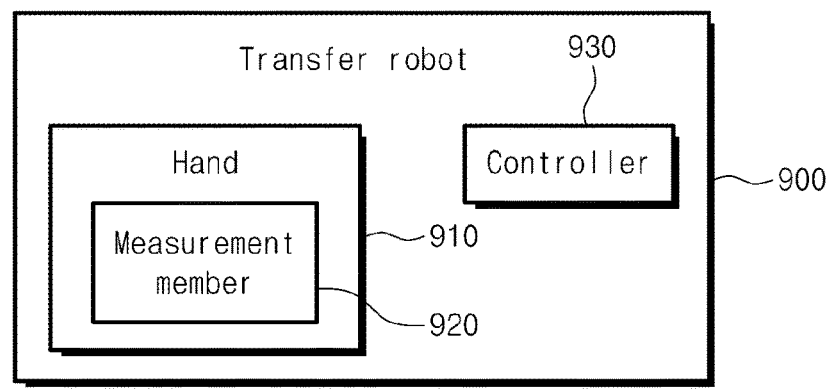
FIG. 13 is a block diagram illustrating a configuration of a transfer robot of FIG. 3.
Figure 14:
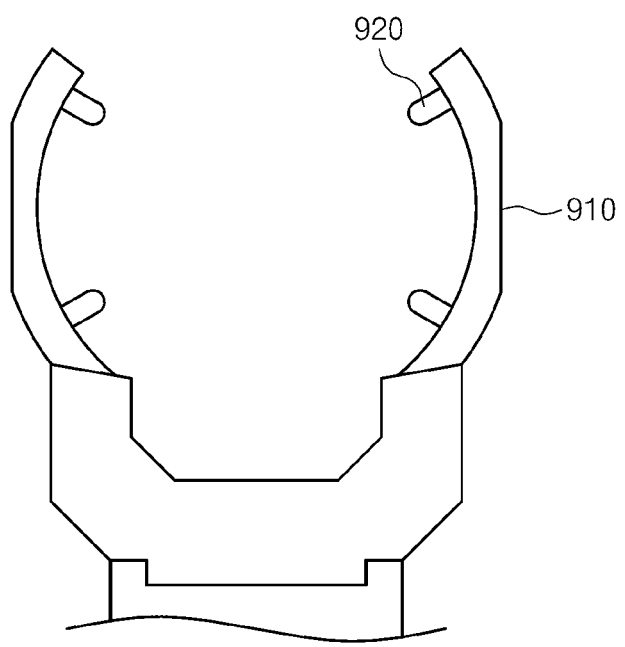
FIG. 14 is a view illustrating a hand and a measurement member of FIG. 13.

As illustrated in FIGS. 13 and 14, the transfer robot 900 may be included in the transfer chamber 430. The transfer robot 900 may include a hand 910, a measurement member 920, and a controller 930.

The hand 910 may displace the substrates W to the process chambers or the substrate alignment apparatuses 800. The measurement member 920 may be provided on the hand 910. The measurement member 920 may measure the alignment states of the substrates W. The controller 930 may receive signals from the measurement member 920 and may determine the alignment states of the substrates W. When a substrate W seated on the hand 910 is misaligned, the controller 930 may control the transfer robot 900 to transfer the substrate W to the substrate alignment apparatus 800.

Figure 15:
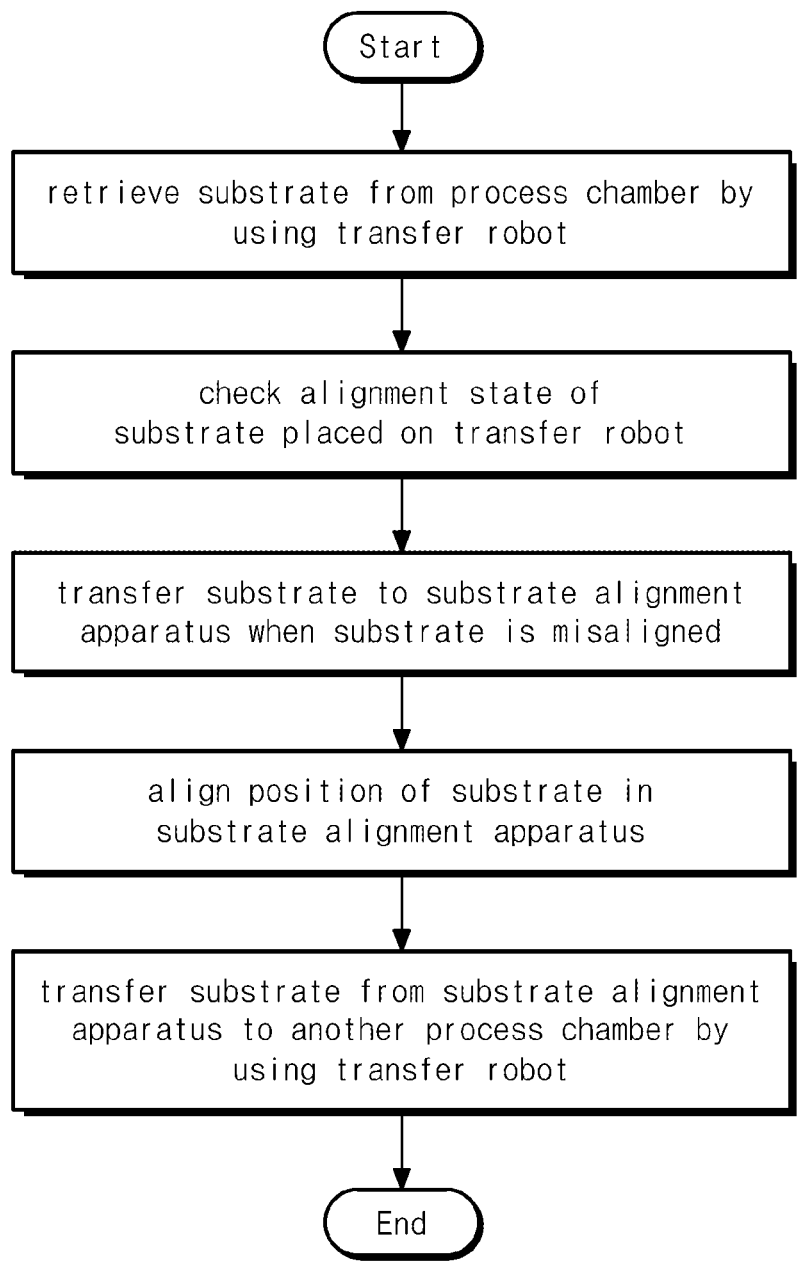
FIG. 15 is a flowchart illustrating a substrate processing method according to an embodiment of the inventive concept.

A substrate processing method using the above-configured substrate processing equipment will be described below with reference to FIG. 15. The transfer robot 900 may retrieve a substrate W from one of the process chambers in the coating and developing module 400. The measurement member 920 on the hand 910 of the transfer robot 900 may measure the alignment state of the substrate W.

When it is determined that the substrate W seated on the hand 910 is misaligned, the transfer robot 900 may transfer the substrate W to the substrate alignment apparatus 800. The position of the substrate W may be aligned in the substrate alignment apparatus 800. The transfer robot 900 may retrieve the substrate W from the substrate alignment apparatus 800 and may transfer the substrate W to another one of the process chambers.

According to the embodiments of the inventive concept, when a substrate W slides along the sloping parts 831a of the guide units 830, the alignment pins 831 rotate, thereby reducing kinetic energy consumption of the substrate W.

Since the height H2 of the body 831b is greater than half the thickness H1 of the substrate W and smaller than the thickness H1 of the substrate W, it is possible to minimize kinetic energy loss of the substrate W due to the contact between the substrate W and the body 831b and thus reduce time taken to align the substrate W.

Furthermore, it is possible to maximize the probability of success in positioning the substrate W and increase the durability life and the maintenance period of the guide unit 830. In addition, it is possible to reduce cost spent on replacing the guide unit 830.

In the above-described embodiments, the guide unit 830 rotates about its axis, and the body 831b of the guide unit 830 has a height smaller than the thickness of the substrate W.

However, the height of the body 831b may not be smaller than the thickness of the substrate W although the guide unit 830 rotates about its axis. Alternatively, the height of the body 831b of the guide unit 830 may be smaller than the thickness of the substrate W, and the guide unit 830 may be fixed to the support plate 820 without rotation.

While the substrate alignment apparatus, the substrate processing apparatus, and the substrate processing method have been described above, the inventive concept is not limited to the above-described embodiments and may be applied to all apparatuses for processing substrates. In particular, the guide unit 830 may be applied to a liquid processing chamber for processing a substrate by supplying liquid to the substrate and a bake chamber for heating a substrate.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for aligning a substrate, the apparatus comprising:
   a support plate; and
   a plurality of guide units coupled to the support plate and configured to align a position of the substrate,
   wherein each of the guide units comprises:
      an alignment pin configured to align the substrate in place; and
      a stationary part having a support surface parallel to the support plate, the support surface configured to support an edge region of the substrate aligned, the stationary part being fixedly coupled to the support plate such that the stationary part is stationary relative to the support plate, and
   wherein the alignment pin is rotatable relative to the support surface of the stationary part about a central axis of the alignment pin.

2. The apparatus of claim 1, wherein the alignment pin comprises:
   a sloping part having a conical or frusto-conical shape with a gradually increasing cross-section toward a bottom; and
   a body extending downward from the sloping part to the support surface of the stationary part and having a side perpendicular to the support plate.

3. The apparatus of claim 2, wherein the alignment pin rotates when the substrate falls along the sloping part.

4. The apparatus of claim 2, wherein the body has a height smaller than a thickness of the substrate.

5. The apparatus of claim 2, wherein the body has a height equal to half a thickness of the substrate.

6. The apparatus of claim 2, wherein one of the body and the support surface has an insertion protrusion, and the other has a recess into which the insertion protrusion is inserted.

7. The apparatus of claim 6, wherein the insertion protrusion has a cylindrical shape and has a diameter smaller than an inner diameter of the recess.

8. The apparatus of claim 6, wherein a bearing is mounted on the insertion protrusion or inserted into the recess.

9. The apparatus of claim 1, wherein the stationary part comprises:
   a support body having the support surface; and
   a support shaft extending from the support body and fixedly coupled to the support plate.

10. An apparatus for aligning a substrate, the apparatus comprising:
    a support plate; and
    a plurality of guide units coupled to the support plate and configured to align a position of the substrate,
    wherein each of the guide units comprises an alignment pin,
    wherein the alignment pin comprises a sloping part having a conical or frusto-conical shape with a gradually increasing cross-section toward a bottom, and a body extending downward from the sloping part to a support surface of a stationary part and having a side perpendicular to the support plate, the support surface being parallel to the support plate and configured to support an edge region of the substrate aligned, and
    wherein the body has a height smaller than a thickness of the substrate.

11. The apparatus of claim 10, wherein the height of the body is equal to half the thickness of the substrate.

12. An apparatus for processing a substrate, the apparatus comprising:
a support plate; and
a plurality of guide units coupled to the support plate and configured to align a position of the substrate,
wherein each of the guide units comprises an alignment pin,
wherein the alignment pin comprises a sloping part having a conical or frusto-conical shape with a gradually increasing cross-section toward a bottom, and a body extending downward from the sloping part to a support surface of a stationary part and having a side perpendicular to the support plate, the support surface being parallel to the support plate and configured to support an edge region of the substrate aligned, and
wherein the alignment pin is rotatable about a central axis of the alignment pin relative to the support plate.

13. The apparatus of claim 12, wherein the body has an insertion protrusion protruding downward from the body,
wherein the support surface has a recess into which the insertion protrusion is inserted, and
wherein the insertion protrusion is rotatable within the recess.

14. The apparatus of claim 12, further comprising:
a heater configured to heat the substrate placed on the support plate.

15. The apparatus of claim 12, wherein the body has a height smaller than a thickness of the substrate.

16. A method for processing a substrate using substrate processing equipment that includes a transfer chamber having a transfer robot configured to transfer the substrate, a plurality of process chambers disposed on a side of the transfer chamber and configured to process the substrate, and a substrate alignment apparatus that is disposed on a side of the transfer chamber, the method comprising:
retrieving a substrate from one of the process chambers by using the transfer robot;
measuring an alignment state of the substrate placed on the transfer robot;
transferring the substrate to the substrate alignment apparatus by the transfer robot when the alignment state is poor;
aligning a position of the substrate in the substrate alignment apparatus; and
retrieving the substrate from the substrate alignment apparatus and then transferring the substrate to another one of the process chambers by the transfer robot,
wherein the substrate alignment apparatus comprises:
a support plate; and
a plurality of guide units coupled to the support plate and configured to align a position of the substrate, each of the guide units comprises:
an alignment pin configured to align the substrate in place; and
a stationary part having a support surface configured to support an edge region of the substrate aligned, the stationary part being fixedly coupled to the support plate, and
wherein the alignment pin is rotatable about a central axis of the alignment pin relative to the support surface of the stationary part.

17. The method of claim 16, wherein the transfer robot comprises:
a hand on which the substrate is placed, the hand being configured to displace the substrate to the process chambers or the substrate alignment apparatus;
a measurement member included in the hand to determine the alignment state of the substrate; and
a controller configured to receive a signal from the measurement member and determine the alignment state of the substrate, and
wherein the controller controls the transfer robot to transfer the substrate to the substrate alignment apparatus when the substrate is misaligned.

18. The method of claim 16, wherein the process chambers comprise:
a liquid processing chamber configured to process the substrate by supplying liquid to the substrate; and
a bake chamber configured to heat the substrate.

* * * * *